United States Patent
Lee et al.

(10) Patent No.: US 7,013,959 B2
(45) Date of Patent: Mar. 21, 2006

(54) INTEGRATED LIQUID COOLING SYSTEM FOR ELECTRICAL COMPONENTS

(75) Inventors: Hsieh Kun Lee, Tu-Chen (TW); Cheng-Tien Lai, Tu-Chen (TW); Zhi Yong Zhou, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/923,185

(22) Filed: Aug. 19, 2004

(65) Prior Publication Data
US 2005/0103475 A1    May 19, 2005

(30) Foreign Application Priority Data
Oct. 28, 2003   (TW) .............................. 92219096 U

(51) Int. Cl.
F28D 15/00    (2006.01)

(52) U.S. Cl. ........................... 165/104.33; 165/104.26; 361/697; 361/704; 174/15.1; 257/714

(58) Field of Classification Search .............. 165/80.4, 165/104.21, 104.33, 104.26, 80.3, 185; 361/697, 361/699, 700, 704; 257/714–716; 174/15.2
See application file for complete search history.

(56) References Cited

U.S. PATENT DOCUMENTS

| | | | | |
|---|---|---|---|---|
| 6,005,772 A | * | 12/1999 | Terao et al. | 361/699 |
| 6,019,165 A | * | 2/2000 | Batchelder | 165/80.3 |
| 6,029,742 A | * | 2/2000 | Burward-Hoy | 165/80.4 |
| 6,166,907 A | * | 12/2000 | Chien | 361/699 |
| 6,263,957 B1 | * | 7/2001 | Chen et al. | 165/80.4 |
| 6,600,649 B1 | * | 7/2003 | Tsai et al. | 361/697 |
| 6,637,231 B1 | * | 10/2003 | Monfarad | 62/259.2 |
| 6,687,122 B1 | * | 2/2004 | Monfarad | 361/687 |
| 2004/0052049 A1 | * | 3/2004 | Wu et al. | 361/699 |

FOREIGN PATENT DOCUMENTS

| | | |
|---|---|---|
| CN | ZL98248834.3 | 11/1999 |
| CN | ZL99210734.2 | 4/2000 |

* cited by examiner

*Primary Examiner*—Terrell Mckinnon
(74) *Attorney, Agent, or Firm*—Wei Te Chung

(57) ABSTRACT

A liquid cooling system includes a heat absorbing unit (4) defining a chamber therein for containing coolant, and a heat dissipation unit (2) comprising a liquid circulation module (20) in flow communication with the heat absorbing unit, and a plurality of cooling fins (27). The liquid circulation module comprises first and second hollow cooling bodies (21, 23) cooperatively defining a space therebetween to receive the cooling fins, and a pump (24) coupled to the second cooling body, so that the first and second cooling bodies, the pump, and the heat absorbing unit together forms a closed loop for circulation of the coolant.

19 Claims, 5 Drawing Sheets

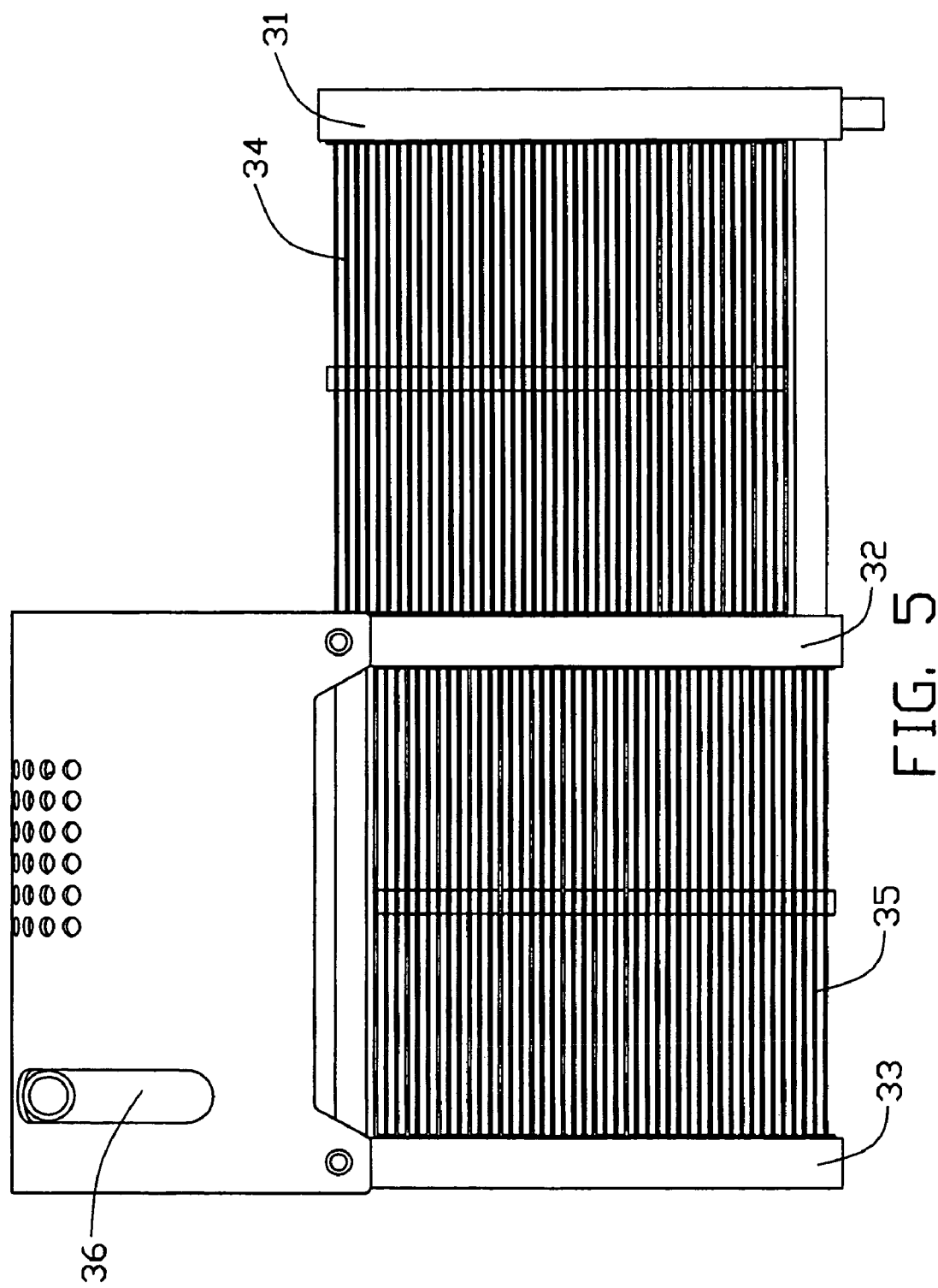

INTEGRATED LIQUID COOLING SYSTEM FOR ELECTRICAL COMPONENTS

BACKGROUND OF THE INVENTION

1. Field of the Invention

The present invention relates generally to cooling systems, and more particularly to a liquid cooling system for rapidly cooling an electrical component such as a Central Processing Unit (CPU).

2. Related Art

With the continuing development of computer electronics technology, new electronic packages such as the latest CPUs can perform more and more functions. Heat generated by these modern electronic packages has increased commensurately. The heat must be removed from the CPUs to prevent them becoming unstable or being damaged. The traditional cooling means such as combined heat sinks and cooling fans are increasingly unable to provide satisfactory cooling performance. Under such circumstances, cooling system using liquid cooling technology is thus developed for cooling the CPUs.

Chinese patent numbers 98248834.3 and 99210734.2 respectively disclose such a kind of cooling system. This kind of cooling system generally comprises a cooling base contact the CPU for absorbing heat generated by the CPU. The cooling base generally defines a cavity for receiving liquid coolant therein, and an inlet and an outlet both in communication with the cavity. The cooling system also comprises a heat sink and a pump arranged at proper places within a computer enclosure. A first tube connects the inlet of the cooling base and the pump, so that the coolant enters the cavity along the first tube. A second tube connects the outlet of the cooling base and the pump, so that the heated coolant exits from the cavity along the second tube. The second tube extends through the heat sink, whereupon heat of the heated coolant is transferred to the heat sink to radiate to ambient air. Thus, the heat of the CPU is continuously taken away by circulation of the coolant.

However, the cooling base, the tubes, the heat sink, and the pump are discrete components prior to attachment within the computer enclosure. Installation and removal of the cooling system can be troublesome and problematic. In addition, a large space for these discrete components is required. This militates against the trend of electrical devices becoming more and more smaller. Further, the coolant generally can not be completely cooled by passing the heat sink, due to a small contact area between the tube and the heat sink.

SUMMARY OF THE INVENTION

Accordingly, an object of the present invention is to provide a liquid cooling system which has an enhanced cooling performance.

Another object of the present invention is to provide a liquid cooling system which can be readily installed or removed to or from an electrical enclosure.

To achieve the above-mentioned objects, a liquid cooling system in accordance with a preferred embodiment of the present invention comprises a heat absorbing unit defining a chamber therein for containing coolant, and a heat dissipation unit comprising a liquid circulation module in flow communication with the heat absorbing unit, and a plurality of cooling fins. The liquid circulation module comprises first and second hollow cooling bodies cooperatively defining a space therebetween to receive the cooling fins, and a pump coupled to the second cooling body, so that the first and second cooling bodies, the pump, and the heat absorbing unit together forms a closed loop for circulation of the coolant.

Other objects, advantages and novel features of the present invention will be drawn from the following detailed description of the preferred embodiment of the present invention with attached drawings, in which:

BRIEF DESCRIPTION OF THE DRAWINGS

FIG. 5 is a schematic view of a liquid cooling system in accordance with an alternative embodiment of the present invention.

DESCRIPTION OF THE PREFERRED EMBODIMENTS

Figure 1:
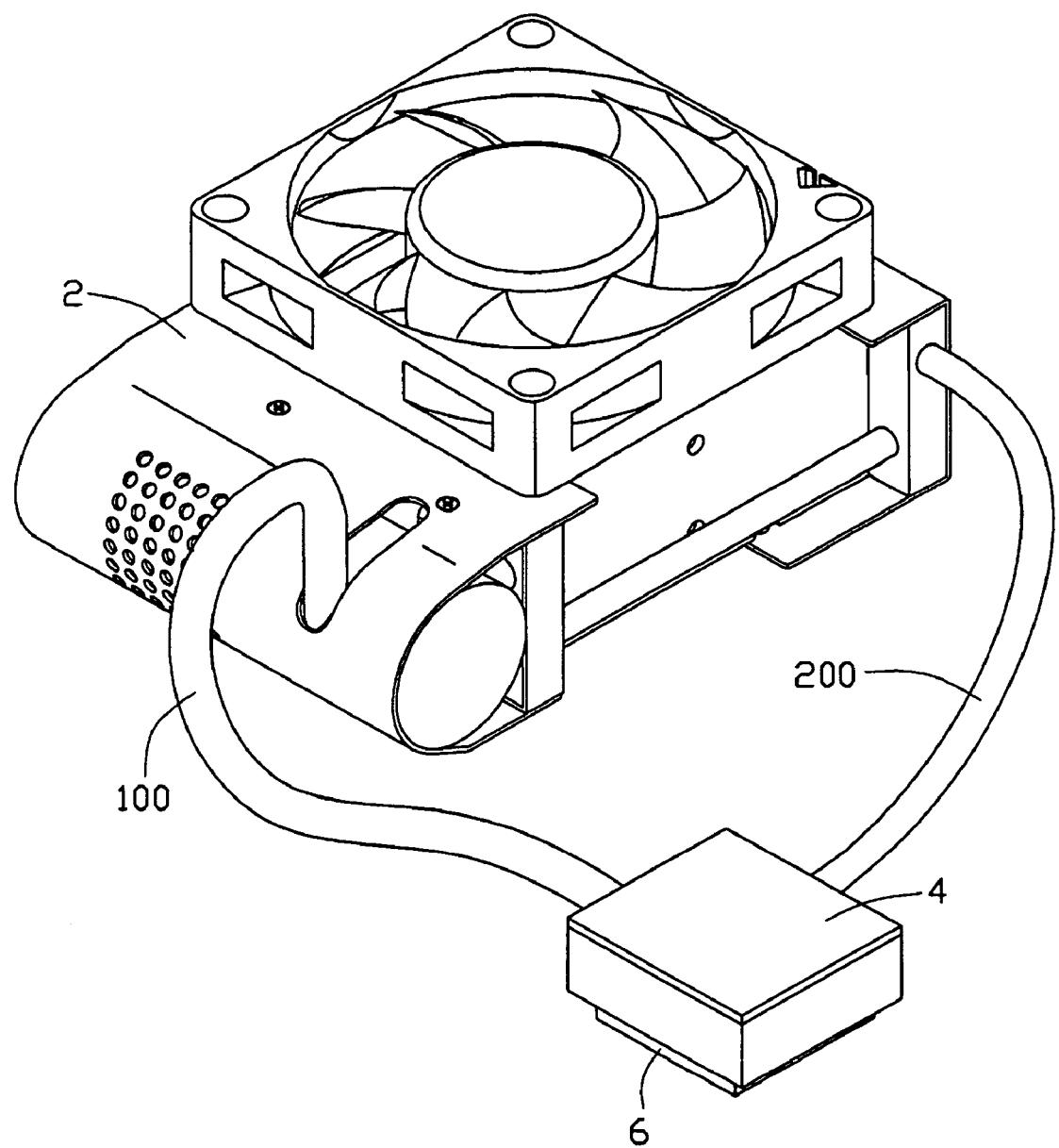
FIG. 1 is an assembled, isometric view of a liquid cooling system in accordance with the preferred embodiment of the present invention, the liquid cooling system comprising a heat absorbing unit and a heat dissipation unit.

Referring to FIG. 1, a liquid cooling system in accordance with a preferred embodiment of the present invention comprises a heat absorbing unit 4 thermally contacting a heat generating component 6, and a heat dissipation unit 2 communicating with the heat absorbing unit 4 by two pipes 100, 200. The heat absorbing unit 4 defines a chamber (not labeled) therein filled with liquid. After absorbing heat from the heat generating component 6, the liquid flows into the heat dissipation unit 2 for dissipation.

Figure 2:
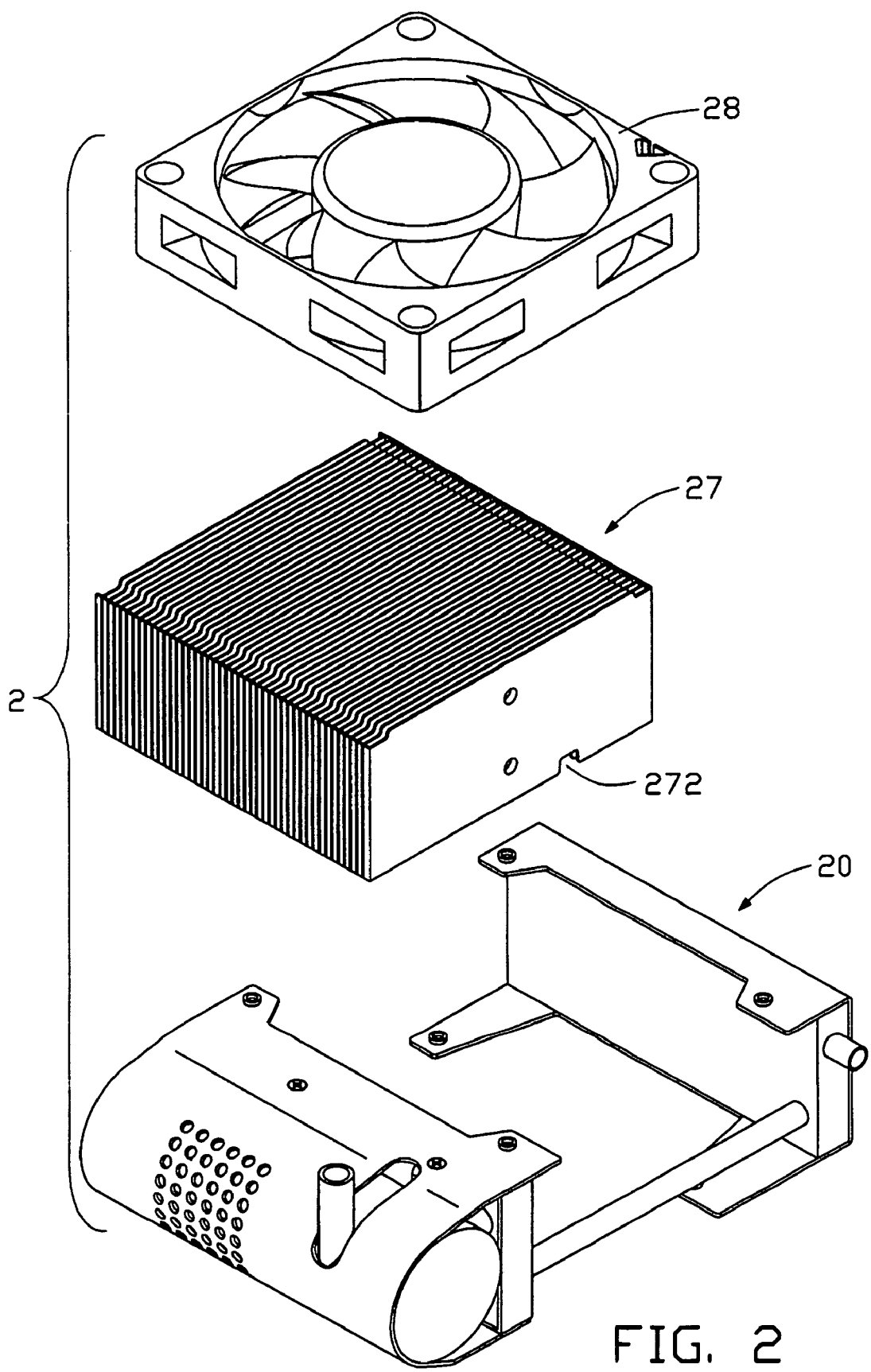
FIG. 2 is an exploded, isometric view of the heat dissipation unit of the liquid cooling system of FIG. 1.

Referring to FIG. 2, the heat dissipation unit 2 comprises a liquid circulation module 20 forming a space therein, a plurality of cooling fins 27 received in said space, and a cooling fan mounted on the cooling fins 27, to enhance cooling performance of the cooling fins 27. A cutout 272 is defined under the cooling fins 27.

Figure 3:
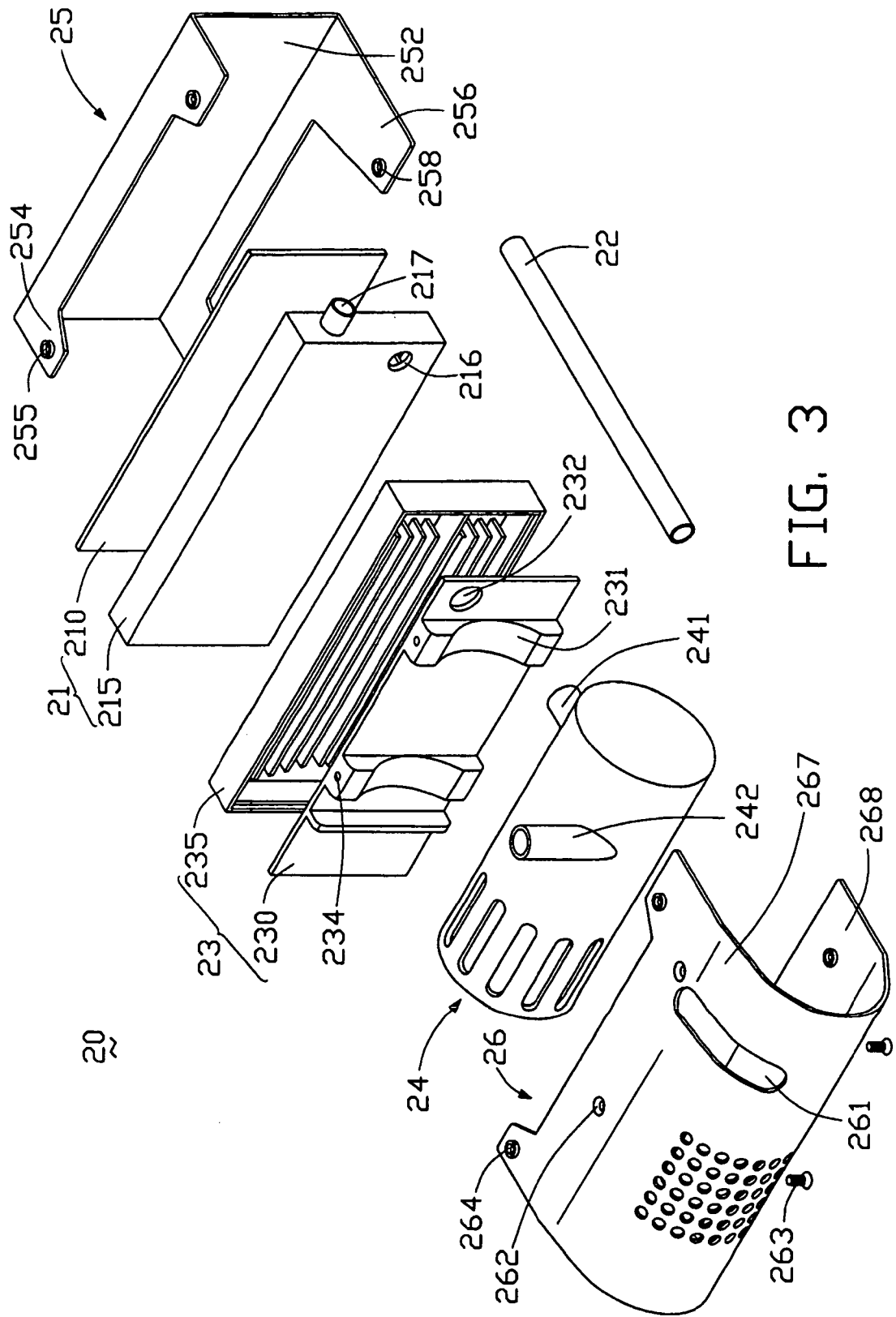
FIG. 3 is an exploded, isometric view of a liquid circulation module of the heat dissipation unit of FIG. 2.

Referring to FIG. 3, the liquid circulation module 20 comprises parallel first and second cooling bodies 21, 23, and a pump 24 coupled to the second cooling body 23. The first and second cooling bodies 21, 23 together form the space therebetween to sandwich the cooling fins 27 therein.

The first cooling body 21 comprises a first base 215 having a first bottom plate (not labeled) thermally attached to one side of the cooling fins 27, and two pair of opposite first side plates (not labeled) extending from the first bottom plate. A first sealing plate 210 is coupled to the first base 215, thereby forming an inner hollow portion in the first cooling body 21. A flow channel is formed in the hollow portion of the first cooling body 21, as will be described later by reference to FIG. 4. A through hole 216 is defined in the first bottom plate. An outlet port 217 is formed on one first side plate, in communication with the pipe 200.

Figure 4:
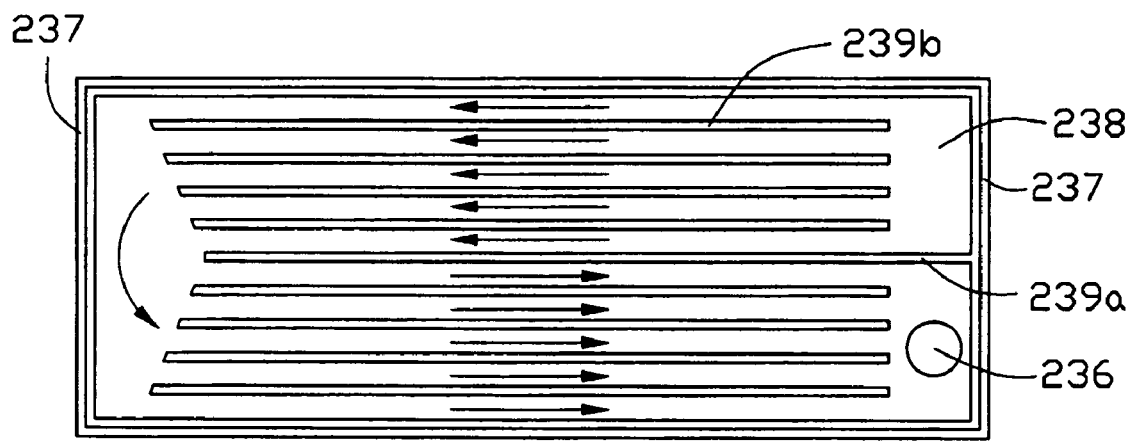
FIG. 4 is a schematic view of a flow channel of one cooling body of the liquid circulation module of FIG. 3.

Referring also to FIG. 4, the second cooling body 23 comprises a second base 235 having a second bottom plate 238 thermally attached to an opposite side of the cooling fins 27, and two pairs of second side plates 237 extending from the second bottom plate 238. A second sealing plate 230 is coupled to the second base 235, thereby forming an inner hollow portion in the second cooling body 23. Two kinds of parallel, equidistant heat exchange fins extend perpendicularly from the second bottom plate 238 of the second base 235, namely one first heat exchange fin 239a that locates at a middle of the second bottom plate 238, and a plurality of second heat exchange fins 239b arranged at opposite sides of the heat exchange fin 239a. One end of the first heat exchange fin 239a connects to one second side plate 237, and an opposite end of the first heat exchange fin 239a spaces an opposite second side plate 237 a distance. Both opposite ends of each second heat exchange fin 239b space the opposite second side plates 237 a distance respectively. A flow channel is thus formed in the hollow portion of the second cooling body 23 by the first and second heat exchange fins 239a, 239b. Understandably, the flow channel of the first cooling body 21 may be formed in the like manner. A through opening 232 is defined in the second sealing plate 230. A through hole 236 is defined in the second bottom plate 238, communicating with the through hole 216 of the first cooling body 21 by aduct 22.

The pump 24 has a generally cylindrical periphery, and forms an inlet port 242 and an exit port 241. The inlet portion 242 communicates with the pipe 100, and the exit port 241 communicates with the through opening 232 of the second sealing plate 230.

The second sealing plate 230 forms a pair of positioning blocks 231 thereon each having an arcuate bearing face, corresponding to an outer peripheral surface of the pump 24. When the pump 24 is placed on the positioning blocks 231, a mounting bracket 26 which covering the pump 24 is attached to the positioning blocks 231 to retain the pump 24 thereat. A fastening aperture 234 is defined in each positioning block 231 at an end thereof. The mounting bracket 26 is configured to be U-shaped, and comprises a pair of generally parallel walls 267, 268 together defining a space therebetween to receive the pump 24 therein. A slot 261 is defined in the mounting bracket 26, for exposure of the inlet port 242. A pair of through apertures 262 is defined in each wall 267, 268, corresponding to the fastening aperture 234 of the positioning block 231. Using fasteners, such as screws 263 to extend through the through apertures 262 into the fastening apertures 234, the mounting bracket 26 can be fixed to the second sealing plate 230. A pair of mounting posts 264 is formed at a free side of the each wall 267, 268.

A mounting frame 25 is provided adjacent the first cooling body 21. The mounting frame 25 comprises a base plate 252, and two upper arms 254 and two lower arms 256 perpendicularly extending from four respective corners of the base plate 252. The first cooling body 21 is thus effectively received between the upper and lower arms 254, 256. The upper arms 254 are less than the lower arms 256 in length. Two mounting posts 255 are formed on the upper arms 254 respectively. The mounting posts 255 of the mounting frame 25 and the mounting posts 264 of the mounting bracket 26 are used to mount the cooling fan 28 on the cooling fins 27. Two protrusions 258 are formed on the lower arms 256 respectively, for engaging with the cooling fins 27 at the cutout 272 thereof.

In operation of the liquid cooling system, the liquid coolant in the heat absorbing unit 4 absorbs heat from the heat generating component 6. Then the heated liquid coolant is pumped into the liquid circulation module 20 to conduct the heat to the cooling fins 27. The heat is finally radiated to ambient air with the help of the cooling fan 28. Thus, circulation of the liquid coolant can continuously take away the heat produced by the heat generating component 6.

In the present invention, the entire system is subdivided into heat absorbing unit 4 and heat dissipation unit 2. The liquid circulation module 20, the cooling fins 27, and the cooling fan 28 of the heat dissipation unit 2 are assembled together prior to attachment to a computer system. Installation or removal of the cooling system to or from the computer system is thus simplified.

FIG. 5 illustrated a liquid cooling system according to an alternative embodiment of the present invention. The liquid cooling system of the alternative embodiment comprises parallel first, second and third cooling bodies 31, 32, 33. The first, second and third cooling bodies 31, 32, 33 of the alternative embodiment each has a similar structure with the first and second cooling bodies 21, 23 of the preferred embodiment. First and second set of cooling fins 34, 35 are sandwiched between the first and second cooling bodies 31, 32, and the second and third cooling bodies 32, 33 respectively. A pump 36 is attached to ends of the second and third cooling bodies 32, 33. Comparing to the preferred embodiment, since heat exchange area is increased, the cooling result is enhanced.

It is understood that the invention may be embodied in other forms without departing from the spirit thereof. The above-descinner walled examples and embodiments are to be considered in all respects as illustrative and not restrictive, and the invention is not to be limited to the details given above.

What is claimed is:

1. A liquid cooling system comprising:
a heat absorbing unit defining a chamber therein for containing coolant; and
a heat dissipation unit comprising a liquid circulation module in flow communication with the chamber, and a plurality of cooling fins, the liquid circulation module comprising first and second hollow cooling bodies cooperatively sandwiching the cooling fins therebetween, and a pump coupled to at least one of the first and second cooling bodies, so that the first and second cooling bodies, the pump, and the heat absorbing unit together form a closed loop for circulation of the coolant;
wherein the first and second cooling bodies comprise a plurality of parallel heat exchange fins extending from inner sides thereof to cooperatively form a flow channel.

2. The liquid cooling system as described in claim 1, wherein the first and second cooling bodies communicate with each other by a duct.

3. The liquid cooling system as described in claim 2, wherein each of the first and second cooling bodies defines an inner hollow portion therein, and forms a flow channel in the inner hollow portion.

4. The liquid cooling system as described in claim 3, wherein each of the first and second cooling bodies comprises a base having a bottom plate and a plurality of side plates extending from the bottom plate, and a sealing plate coupled to the base so as to form the inner hollow portion.

5. The liquid cooling system as described in claim 4, wherein the plurality of parallel heat exchange fins forming the flow channel extend from the bottom plates of the first and second cooling bodies.

6. The liquid cooling system as described in claim 4, wherein the pump is coupled to the sealing plate of the second cooling body, and communicates with the inner hollow portion of one of the first and second cooling bodies.

7. The liquid cooling system as described in claim 6, wherein the sealing plate of the second cooling body forms a positioning block to position the pump thereon, and a mounting bracket is attached to the second cooling body, the mounting bracket and the positioning block cooperatively defining a space therebetween to sandwich the pump therein.

8. The liquid cooling system as described in claim 1, further comprising a cooling fan attached on the cooling fins.

9. The liquid cooling system as described in claim 1, further comprising a third cooling body together with the second cooling body to define another space therebetween, and a plurality of other cooling fins sandwiched in said another space.

10. A liquid cooling system comprising:
   a best absorbing unit defining a chamber therein for containing coolant and a face for contacting a heat source; and
   a heat dissipation unit communicating with the chamber via two pipes, comprising:
   a liquid circulation module being in flow communication with the chamber; and
   a plurality of spaced cooling fins,
   the liquid circulation module comprising:
   at least one hollow cooling body, said cooling fins defining ends in thermal contact with said cooling body;
   a pump communicating the cooling body with the chamber via said pipes; and
   a mounting bracket covering the pump;
   wherein
   said liquid circulation module is formed as one unitary piece, and spatially discrete from said heat absorbing unit.

11. The liquid cooling system as described in claim 10, wherein said fins are spaced from one another in a parallel relation.

12. The liquid cooling system as described in claim 10, wherein a fan is located upon the fins.

13. The liquid cooling system as described in claim 12, wherein said fan and said pump are located on two different sides of said fins.

14. The liquid cooling system as described in claim 13, wherein said two different sides are perpendicular to each other.

15. The liquid cooling system as described in claim 10, wherein there are three cooling bodies with two sets of fins respectively between every adjacent two cooling bodies so as to increase an amount of sets of the combined cooling body and fins.

16. A method of removing heat from a heat source, comprising steps of:
   positioning a heat absorbing unit upon the heat source, said heat absorbing unit defining a chamber therein;
   positioning a heat dissipation unit spaced from said heat absorbing unit with a distance therebetween and thermally connected to said heat absorbing unit via at least two pipes,
   providing said heat dissipation unit with a liquid circulation module in flow communication with the chamber, and a plurality of cooling fins, said liquid circulation module including at least one hollow cooling body and a pump communicating the cooling body with the chamber via said two pipes,
   positioning the cooling fins being in thermal contact with said cooling body; wherein
   said liquid circulation module is formed as one piece;
   wherein the at least one hollow cooling body comprises a plurality of parallel heat exchange fins extending from an inner side thereof to cooperatively form a flow channel.

17. The liquid cooling system as described in claim 1, wherein the heat dissipation unit communicates with the chamber via two pipes.

18. The liquid cooling system as described in claim 17, wherein opposite lateral sides of the cooling fins intimately contact with the first and second cooling bodies.

19. The liquid cooling system as described in claim 18, wherein a mounting bracket covers the pump.

* * * * *